United States Patent
Iantorno

(10) Patent No.: US 12,308,077 B2
(45) Date of Patent: May 20, 2025

(54) 3D MEMORY DEVICE AND PROGRAMMING METHOD THEREOF

(71) Applicant: SK hynix Inc., Icheon-si (KR)

(72) Inventor: Amedeo Iantorno, Agrate Brianza (IT)

(73) Assignee: SK hynix Inc., Icheon-si (KR)

( * ) Notice: Subject to any disclaimer, the term of this patent is extended or adjusted under 35 U.S.C. 154(b) by 205 days.

(21) Appl. No.: 17/958,688

(22) Filed: Oct. 3, 2022

(65) Prior Publication Data

US 2023/0352106 A1    Nov. 2, 2023

(30) Foreign Application Priority Data

Apr. 27, 2022   (IT) .................... 102022000008348

(51) Int. Cl.
   *G11C 16/10*   (2006.01)
   *G11C 16/04*   (2006.01)
   *G11C 16/34*   (2006.01)

(52) U.S. Cl.
   CPC ...... *G11C 16/3459* (2013.01); *G11C 16/0483* (2013.01); *G11C 16/10* (2013.01)

(58) Field of Classification Search
   CPC . G11C 16/3459; G11C 16/0483; G11C 16/10; G11C 11/5628; G11C 29/24; G11C 2029/1202; G11C 2029/4402; G11C 29/028; G11C 29/021; G11C 16/08; G11C 16/24; G11C 16/34
   See application file for complete search history.

(56) References Cited

U.S. PATENT DOCUMENTS

| | | | |
|---|---|---|---|
| 8,223,557 B2 | 7/2012 | Komatsu | |
| 8,539,138 B2 | 9/2013 | Kim et al. | |
| 11,989,082 B2* | 5/2024 | Kim | G06F 12/0882 |
| 2015/0078093 A1* | 3/2015 | Hahn | G11C 11/5628 365/185.19 |
| 2017/0125117 A1 | 5/2017 | Tseng et al. | |
| 2018/0151236 A1* | 5/2018 | Park | G11C 16/10 |
| 2020/0402580 A1 | 12/2020 | Kim et al. | |

* cited by examiner

*Primary Examiner* — Huan Hoang
*Assistant Examiner* — Bradley S Coon
(74) *Attorney, Agent, or Firm* — WILLIAM PARK & ASSOCIATES LTD.

(57) ABSTRACT

A three-dimensional memory device according to the present technology is proposed. The three-dimensional memory device includes a plurality of memory cell strings each memory cell string including a plurality of memory cells, a plurality of word lines each one associated with respective memory cells of the plurality of memory cell strings arranged at a same vertical distance from the substrate, and a control circuit. The control circuit is configured to apply a sequence of incremental step programming pulses to a selected memory cell, perform program verify after applying a first programming pulse, and determine an updated first programming pulse based on a second programming pulse indicating that the selected memory cell has been programmed and perform the program verify operations starting from the updated first programming pulse for each subsequently-selected memory cell.

11 Claims, 6 Drawing Sheets

FIG. 2A

| | $P_1$ | $P_2$ | $P_3$ | $P_4$ | $P_5$ | $P_6$ | $P_7$ | $P_8$ | $P_9$ | $P_{10}$ | $P_{11}$ | $P_{12}$ | $P_{13}$ | $P_{14}$ | $P_{15}$ | $P_{16}$ | $P_{17}$ | $P_{18}$ | $P_{19}$ | $P_{20}$ | $P_{21}$ | $P_{22}$ |
|---|---|---|---|---|---|---|---|---|---|---|---|---|---|---|---|---|---|---|---|---|---|---|
| $Vth_1$ | PV | PV | PV | PV | PV | PV | PV | PV | PV | | | | | | | | | | | | | |
| $Vth_2$ | | | | | PV | PV | PV | PV | PV | PV | PV | PV | | | | | | | | | | |
| $Vth_3$ | | | | | | | PV | | PV | PV | PV | PV | PV | PV | | | | | | | | |
| $Vth_4$ | | | | | | | | | | PV | PV | PV | PV | PV | PV | PV | | | | | | |
| $Vth_5$ | | | | | | | | | | | | PV | PV | PV | PV | PV | PV | PV | PV | | | |
| $Vth_6$ | | | | | | | | | | | | | | | PV | PV | PV | PV | PV | PV | PV | |
| $Vth_7$ | | | | | | | | | | | | | | | | | PV | PV | PV | PV | PV | PV |

FIG. 2B

|  | $P_1$ | $P_2$ | $P_3$ | $P_4$ | $P_5$ | $P_6$ | $P_7$ | $P_8$ | $P_9$ | $P_{10}$ | $P_{11}$ | $P_{12}$ | $P_{13}$ | $P_{14}$ | $P_{15}$ | $P_{16}$ | $P_{17}$ | $P_{18}$ | $P_{19}$ | $P_{20}$ | $P_{21}$ | $P_{22}$ |
|---|---|---|---|---|---|---|---|---|---|---|---|---|---|---|---|---|---|---|---|---|---|---|
| $Vth_1$ | PV | PV | PV | PV | PV | PV | PV |  |  |  |  |  |  |  |  |  |  |  |  |  |  |  |
| $Vth_2$ |  |  |  |  | PV | PV | PV | PV | PV | PV |  |  |  |  |  |  |  |  |  |  |  |  |
| $Vth_3$ |  |  |  |  |  |  | PV | PV | PV | PV | PV | PV |  |  |  |  |  |  |  |  |  |  |
| $Vth_4$ |  |  |  |  |  |  |  |  |  | PV | PV | PV | PV |  |  |  |  |  |  |  |  |  |
| $Vth_5$ |  |  |  |  |  |  |  |  |  |  |  | PV | PV | PV |  |  |  |  |  |  |  |  |
| $Vth_6$ |  |  |  |  |  |  |  |  |  |  |  |  |  |  | PV | PV | PV |  |  |  |  |  |
| $Vth_7$ |  |  |  |  |  |  |  |  |  |  |  |  |  |  |  | PV | PV | PV | PV | PV | PV |  |

FIG. 2C

| | $P_1$ | $P_2$ | $P_3$ | $P_4$ | $P_5$ | $P_6$ | $P_7$ | $P_8$ | $P_9$ | $P_{10}$ | $P_{11}$ | $P_{12}$ | $P_{13}$ | $P_{14}$ | $P_{15}$ | $P_{16}$ | $P_{17}$ | $P_{18}$ | $P_{19}$ | $P_{20}$ | $P_{21}$ | $P_{22}$ |
|---|---|---|---|---|---|---|---|---|---|---|---|---|---|---|---|---|---|---|---|---|---|---|
| $Vth_1$ | X | X | X | X | | | | | | | | | | | | | | | | | | |
| $Vth_2$ | | | | | PV | PV | PV | PV | PV | | | | | | | | | | | | | |
| $Vth_3$ | | | | | X | X | X | PV | PV | PV | PV | PV | | | | | | | | | | |
| $Vth_4$ | | | | | | | | X | X | X | PV | PV | PV | PV | PV | | | | | | | |
| $Vth_5$ | | | | | | | | | | | X | X | X | PV | PV | PV | PV | PV | | | | |
| $Vth_6$ | | | | | | | | | | | | | | X | X | X | PV | PV | PV | PV | PV | |
| $Vth_7$ | | | | | | | | | | | | | | | | | X | X | X | PV | PV | PV |

…

3D MEMORY DEVICE AND PROGRAMMING METHOD THEREOF

CROSS-REFERENCE TO RELATED APPLICATION

The present application claims priority under 35 U.S.C. § 119(a) to Italian patent application no. 102022000008348, filed on Apr. 27, 2022, in the Italian Patent and Trademark Office, the entire disclosure of which is incorporated by reference herein.

BACKGROUND

1. Technical Field

The present disclosure generally relates to the field of memory devices. Particularly, the present disclosure relates to a solid state memory device. More particularly, the present disclosure relates to a three-dimensional (3D) memory device featuring fast programming times.

2. Related Art

A conventional 3D memory device comprises a plurality of memory cell strings. Each memory cell string typically comprises a plurality of memory cells stacked onto one another on a substrate each one at a respective vertical distance from the substrate.

The memory cells are programmable to store each one a logic level among a plurality of logic levels.

Each memory cell typically comprises a MOS transistor with a charge trap or floating gate structure (hereinafter, memory transistor), i.e. it comprises a drain terminal, a source terminal, a control terminal (control gate), and a control region buried in an oxide layer in order to be electrically isolated. For example, the control region may comprise silicon nitride (charge trap structure) or doped polycrystalline silicon (floating gate structure).

A logic level is physically stored in each memory cell in the form of electric charge within the control region: a change of electric charge within the control region defines a corresponding change of a threshold voltage of the memory transistor. Such change of the threshold voltage determines, during a read operation of a selected memory cell, a corresponding modulation of a channel current through the memory transistor, whose value represents the logic level being stored in the memory cell.

Each memory cell may be a single-level memory cell, i.e. a memory cell capable of storing one bit (i.e., logic level 0 or 1), or a multi-level memory cell, i.e. a memory cell capable of storing two bits (i.e., logic level 00, 01, 10, or 11), three bits (i.e., logic level 000, 001, 010, 011, 100, 101, 110 or 111), or more bits.

According to a common implementation, a selected memory cell is programmed at a target logic level (or, equivalently, at a target threshold voltage) based on an ISPP ("Incremental Step Pulse Programming") technique.

According to the ISPP technique, a sequence of incremental step programming pulses are applied to the selected memory cell. The sequence of incremental step programming pulses (hereinafter concisely referred to as sequence of programming pulses) comprise a sequence of short successive programming (voltage) pulses with gradually-increasing magnitude on a step-voltage basis ("ISPP voltage step"). In order to compensate for changes in the memory cell size in each memory cell string, which otherwise would determine a programming time variability over the respective memory cells, a number of ISPP voltage steps may be provided, wherein each ISPP voltage step is associated with a respective group of memory cells (hereinafter, ISPP group of memory cells).

According to the ISPP technique, a plurality of program verify operations are performed to check whether the selected memory cell has been programmed at the target threshold voltage.

For each target threshold voltage, application of the programming pulse and the subsequent program verify operation are repeated until the threshold voltage of the selected memory cell rises above a corresponding program verify voltage indicative that the selected memory cell has been programmed at the target threshold voltage.

To optimize programming times, the programming pulse from which the program verify operation is started (hereinafter referred to as a PV ("Program Verify") start programming pulse) is typically variable over the target threshold voltages.

The PV start programming pulses associated with (all) the target threshold voltages at which each memory cell may be programmed are referred to, as a whole, as a PV ("Program Verify") scheme.

SUMMARY

Conventional 3D memory devices, and particularly the conventional PV schemes they are based on, might not be satisfactory when very fast programming times are required.

This is essentially due to the fact that, for each target threshold voltage, the PV start programming pulse is a predefined programming pulse typically determined during a characterization phase based on the memory cell, among the memory cells of the ISPP group of memory cells, having fastest programming times (hereinafter, fastest memory cell): indeed, for each ISPP group of memory cells, the PV start programming pulse is typically determined as the programming pulse that precedes, with a predefined margin, a final programming pulse of the fastest memory cell of the ISPP group of memory cells.

Thus, conventional PV schemes provide for fixed PV start programming pulses for all the memory cells belonging to a same ISPP group of memory cells.

Conventional PV schemes provide unnecessary program verify operations for slower memory cells of ISPP group of memory cells, which implies slower programming times.

The Applicant has faced the above-indicated issues, and has devised a 3D memory device capable of determining efficient PV schemes capable of reducing the programming times.

One or more aspects of the present teachings are set out in the independent claims, with advantageous features of the same teachings that are indicated in the dependent claims, whose wording is enclosed herein verbatim by reference (with any advantageous feature being provided with reference to a specific aspect of the present teachings that applies mutatis mutandis to any other aspect).

More specifically, an aspect of the present teachings relates to a three-dimensional memory device. The three-dimensional memory device may comprise a plurality of memory cell strings; each memory cell string may comprise a plurality of memory cells stacked onto one another on a substrate each one at a respective vertical distance from the substrate. The three-dimensional memory device may comprise a plurality of word lines each one associated with respective memory cells of the plurality of memory cell strings arranged at a same vertical distance from the substrate. The three-dimensional memory device may comprise a control circuit configured to:
(i) apply a sequence of incremental step programming pulses to a selected memory cell of a reference memory cell string to program the selected memory cell at a target threshold voltage among a plurality of target threshold voltages;
(ii) perform program verify operations in response to a respective programming pulse after applying a first programming pulse of the sequence of incremental step programming pulses, the first programming pulse for a start of the program verify operations being a predefined programming pulse determined by the three-dimensional memory device.

The control circuit may be further configured to:
(iii) determine an updated first programming pulse for the selected memory cell and for the target threshold voltage based on a second programming pulse that is a final programming pulse of the sequence of incremental step programming pulses after which a program verify operation determines that the selected memory cell has been programmed at the target threshold voltage, and
(iv) perform the program verify operations starting from the updated first programming pulse for each subsequently-selected memory cell to be programmed at the target threshold voltage and associated with the same word line as the selected memory cell.

Another aspect of the present teachings relates to an electronic system comprising at least one three-dimensional memory device of above.

A further aspect of the present teachings relates to a method for operating a three-dimensional memory device. The three-dimensional memory device may comprise a plurality of memory cell strings each one comprising a plurality of memory cells stacked onto one another on a substrate each one at a respective vertical distance from the substrate, and a plurality of word lines each one associated with respective memory cells of the plurality of memory cell strings arranged at a same vertical distance from the substrate. The method may comprise:
(i) applying a sequence of incremental step programming pulses to a selected memory cell of a reference memory cell string to program the selected memory cell at a target threshold voltage among a plurality of target threshold voltages;
(ii) performing program verify operations in response to a respective programming pulse after applying a first programming pulse of the sequence of incremental step programming pulses, the first programming pulse for a start of the program verify operations being a predefined programming pulse determined by the three-dimensional memory device;
(iii) determining an updated first programming pulse for the selected memory cell and for the target threshold voltage based on a second programming pulse that is a final programming pulse of the sequence of incremental step programming pulses after which a program verify operation determines that the selected memory cell has been programmed at the target threshold voltage, and
(iv) performing the program verify operations starting from the updated first programming pulse for each subsequently-selected memory cell to be programmed at the target threshold voltage and associated with the same word line as the selected memory cell.

BRIEF DESCRIPTION OF THE DRAWINGS

These and other features and advantages of the present disclosure will be made apparent by the following description of some non-limitative embodiments thereof; for its better intelligibility, the following description should be read making reference to the attached drawings, wherein:

FIG. 2A shows a program verify scheme for TLC memory cells, according to an embodiment of the present disclosure;

FIG. 2B shows a predefined program verify scheme for the TLC memory cells, according to an embodiment of the present disclosure;

FIG. 2C shows an updated program verify scheme according to an embodiment of the present disclosure;

DETAILED DESCRIPTION

Figure 1:
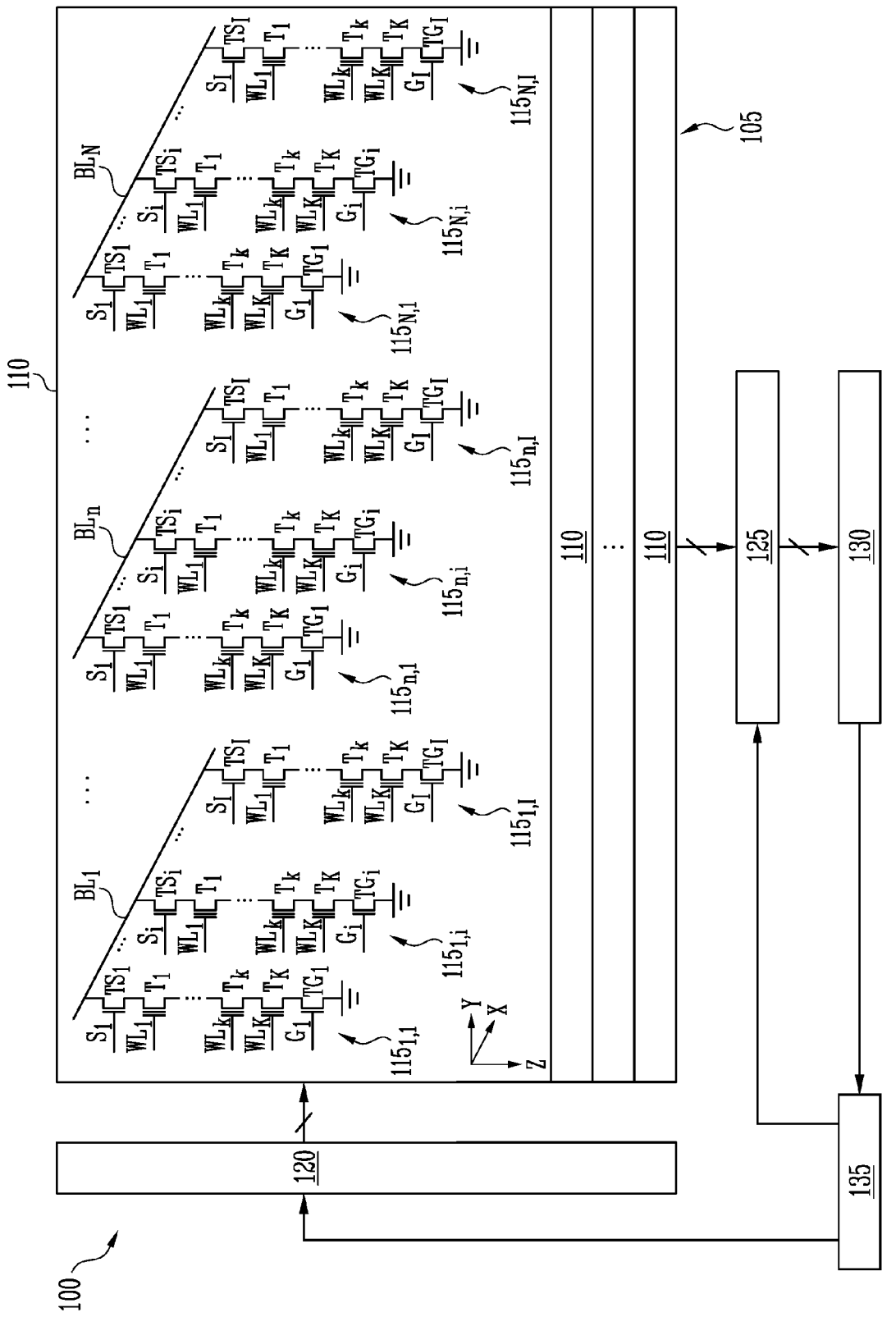
FIG. 1 schematically shows a three-dimensional memory device according to an embodiment of the present disclosure.

FIG. 1 schematically shows a three-dimensional (3D) memory device 100 according to an embodiment of the present disclosure.

In the following, features introduced by the wording "according to an embodiment" are to be construed as features additional or alternative to any features previously introduced, unless otherwise indicated and/or unless there is evident incompatibility among feature combinations.

In the following, only elements and operations deemed relevant for the understanding of the present disclosure will be shown and described, with other well-known elements and operations that will be intentionally omitted for the sake of conciseness.

The 3D memory device 100 comprises a memory array 105.

According to an embodiment, the memory array 105 comprises a plurality of memory blocks 110.

According to an embodiment, each memory block 110 comprises a plurality of memory cell strings $115_{n,i}$ (n=1, 2, ... N; i=1, 2, ... I). The plurality of memory cell strings $115_{n,i}$ of a generic memory block 110 are illustrated in the figure in a three-dimensional view with reference to the mutually-orthogonal axis X,Y,Z.

According to an embodiment, each memory cell string $115_{n,i}$ comprises a plurality of memory cells $T_k$ (k=1, 2, ... K) stacked onto one another on a substrate (not shown) each one at a respective vertical distance (i.e., the distance along the Z axis) from the substrate.

According to an embodiment, the memory cells $T_k$ of each memory cell string $115_{n,i}$ are connected in series to each other (NAND memory cell string).

According to an embodiment, each memory cell $T_k$ is programmable to store each one a logic level among a plurality of logic levels.

According to an embodiment, each memory cell $T_k$ comprises a MOS transistor with a charge trap or floating gate structure (hereinafter, memory transistor), i.e. it comprises a drain terminal, a source terminal, a control terminal (control gate), and a control region buried in an oxide layer in order to be electrically isolated. The control region may comprise silicon nitride (charge trap structure) or doped polycrystalline silicon (floating gate structure).

A logic level is physically stored in each memory cell $T_k$ in the form of electric charge within the control region: a change of electric charge within the control region defines a corresponding change of a threshold voltage of the memory transistor. Such change of the threshold voltage determines, during a read operation of a selected memory cell, a corresponding modulation of a channel current through the memory transistor, whose value represents the logic level being stored in the memory cell $T_k$.

During a programming operation, an injection of electric charges occurs within the control region by "Fowler-Nordheim tunneling" effect (floating gate structure) or by "Hot Carrier Injection" effect (charge trap structure): according to "Fowler-Nordheim tunneling"/"Hot Carrier Injection" effects, an electric field between the control gate and the drain terminal of the memory transistor allows electric charges to pass through the oxide layer and reach the control region.

According to an embodiment, each memory cell $T_k$ may be a single-level memory cell, i.e. a memory cell capable of storing one bit. Each single-level memory cell is programmable to store a logic level between two logic levels (i.e., 0 and 1).

According to an embodiment, each memory cell $T_k$ may be a multi-level memory cell, i.e. a memory cell capable of storing two or more bits.

Considering, just as an example, a multi-level memory cell capable of storing two bits, the multi-level memory cell may be programmable to store a logic level among four logic levels (i.e., 00, 01, 10, and 11).

Considering, just as another example, a multi-level memory cell capable of storing three bits, the multi-level memory cell (usually referred to as TLC ("Triple-Level Cell") memory cell) may be programmable to store a logic level among eight logic levels (i.e., 000, 001, 010, 011, 100, 101, 110, and 111).

According to an embodiment, the 3D memory device 100 comprises a plurality of word lines $WL_k$ (k=1, 2, ... K) each one associated with respective memory cells of the plurality of memory cell strings $115_{n,i}$ arranged at a same vertical distance from the substrate (i.e., the memory cells arranged on a same k-th X-Y plane).

According to an embodiment, the 3D memory device 100 comprises, along the Y axis, a plurality of bit lines $BL_n$ (n=1, 2, ... N) each one associated with a corresponding set of memory cell strings $115_{n,i}$, i.e. with the bit line $BL_1$ that is associated with the set of memory cell strings $115_{1,1}$, $115_{1,i}$,$115_{1,I}$, with the bit line $BL_n$ that is associated with the set of memory cell strings $115_{n,1}$,$115_{n,i}$,$115_{n,I}$, and with the bit line $BL_N$ that is associated with the set of memory cell strings $115_{n,1}$,$115_{n,i}$,$115_{n,I}$.

According to an embodiment, each memory cell string $115_{n,i}$ is electrically coupled between the associated bit line $BL_n$ and a ground line providing a ground (or earth) electric potential (such as 0 V, as usual in electronic circuits).

According to an embodiment, the 3D memory device 100 comprises a plurality of string selection transistors $TS_i$. According to an embodiment, each memory cell string $115_{n,i}$ is associated with a respective string selection transistor $TS_i$ for selectively coupling the (memory cells $T_k$ of the) memory cell string $115_{n,i}$ to the respective bit line $BL_n$. According to an embodiment, each memory cell string $115_{n,i}$ is electrically connected to the associated bit line $BL_n$ through the respective string selection transistor $TS_i$.

According to an embodiment, the 3D memory device 100 comprises a plurality of ground selection transistors $TG_i$. According to an embodiment, each memory cell string $115_{n,i}$ is associated with a respective ground selection transistor $TG_i$ for selectively coupling the (memory cells $T_k$ of the) memory cell string $115_{n,i}$ to the ground line. According to an embodiment, each memory cell string $115_{n,i}$ is electrically connected to the associated ground line through the respective ground selection transistor $TG_i$.

According to an embodiment, the 3D memory device 100 comprises a plurality of string selection lines $S_i$ each one for selecting the respective string selection transistors $TS_i$, and a plurality of ground selection lines $G_i$ each one for selecting the respective ground selection transistors $TG_i$.

According to an embodiment, the 3D memory device 100 comprises a word line selection circuit 120 for selecting one or more word lines among the plurality of word lines $WL_k$ according to a row address.

According to an embodiment, the 3D memory device 100 comprises a bit line selection circuit 125 for selecting one or more bit lines among the plurality of bit lines $BL_n$ according to a column address.

According to an embodiment, the 3D memory device 100 comprises a string/ground selection circuit (not shown) for selecting one or more string selection lines among the plurality of string selection lines $S_i$ and/or one or more ground selection lines among the plurality of ground selection lines $G_i$.

According to an embodiment, the 3D memory device 100 comprises a reading circuit 130 for reading the logic level of (i.e., stored in) a selected memory cell $T_k$.

According to an embodiment, the reading circuit 130 is configured to read the logic level of the selected memory cell according to an electric current flowing through the bit line $BL_n$ associated with the selected memory cell $T_k$.

According to an embodiment, the 3D memory device 100 comprises a control circuit (hereinafter, memory controller) 135 configured to control an overall operation of the 3D memory device 100. As conceptually represented in the figure by respective arrow connections, the memory controller 135 may be configured to provide the row address to the word line selection circuit 120, to provide the column address to the bit line selection circuit 125, to provide an address of the memory cell string $115_{n,i}$ and to receive the logic level being read by the reading circuit 130.

According to an embodiment, the memory controller 135 is configured to program a selected memory cell of a selected memory cell string at a target logic level (or, equivalently, at a target threshold voltage) based on ISPP ("Incremental Step Pulse Programming") technique.

According to ISPP technique, a sequence of incremental step programming pulses are applied (e.g., by or under the control of the memory controller 135) to the selected memory cell $T_k$. According to an embodiment, the sequence of incremental step programming pulses (hereinafter concisely referred to as sequence of programming pulses) comprise a sequence of short successive programming (voltage) pulses with gradually-increasing magnitude on a step-voltage basis. The magnitude of this "step" (i.e., the increase in magnitude of each programming pulse relative to the immediately previous programming pulse in the sequence, or, equivalently, the increase in magnitude between subsequent programing pulses in the sequence) is herein referred to as "ISPP voltage step". Without losing generality, in practical implementations of the 3D memory device 100, a number of ISPP voltage steps may be provided, each ISPP voltage step being associated with a respective group of memory cells (in the following, each group of memory cells associated with a respective ISPP voltage step will be referred to as ISPP group of memory cells): just as an example, different ISPP voltage steps for different ISPP groups of memory cells may allow compensating for changes in the memory cell size in each memory cell string (i.e., along the Z axis), which otherwise would determine a programming time variability over the respective memory cells.

According to ISPP technique, a plurality of program verify operations are performed (e.g., by or under the control of the memory controller 135) to check whether the selected memory cell has been programmed at the target threshold voltage.

As illustrated in FIG. 2A, which shows a program verify scheme (hereinafter, PV scheme) resulting from application of the ISPP technique to program one or more TLC memory cells, for each target threshold voltage $Vth_h$ (h=1, 2, ... 7), each program verify operation (denoted by PV in the figure) is performed after a respective programming pulse of the sequence of programming pulses $P_1$-$P_{22}$ ($P_1$ being an initial programming pulse of the sequence of programming pulses), starting from a first programming pulse (in the PV scheme, the programming pulse $P_1$, $P_5$, $P_7$, $P_{10}$, $P_{12}$, $P_{15}$, $P_{17}$ for the target threshold voltage $Vth_1$, $Vth_2$, $Vth_3$, $Vth_4$, $Vth_5$, $Vth_6$, $Vth_7$, respectively) to a second programming pulse (in the PV scheme, the programming pulse $P_9$, $P_{12}$, $P_{14}$, $P_{16}$, $P_{19}$, $P_{21}$, $P_{22}$ for the target threshold voltage $Vth_1$, $Vth_2$, $Vth_3$, $Vth_4$, $Vth_5$, $Vth_6$, $Vth_7$, respectively), wherein, for each target threshold voltage $Vth_h$, the program verify operation performed after the corresponding second programming pulse determines that the selected memory cell has been programmed at the target threshold voltage $Vth_h$.

In other words, for each target threshold voltage $Vth_h$, application of the programming pulse and the subsequent program verify operation are repeated from the respective first programming pulse until the threshold voltage of the selected memory cell rises above a corresponding program verify voltage indicative that the selected memory cell has been programmed at the target threshold voltage $Vth_h$.

According to an embodiment, for each target threshold voltage $Vth_h$, the corresponding first programming pulse represents the programming pulse from which the program verify operation is started (in the following, it will be referred to as PV ("Program Verify") start programming pulse.

According to an embodiment, for each target threshold voltage $Vth_h$, the corresponding second programming pulse represents the programming pulse after which the program verify operation is ended, i.e. the programming pulse in response to which the respective program verify operation determines that the selected memory cell has been programmed at the target threshold voltage $Vth_h$ and, hence, the end of the sequence of programming pulses (otherwise stated, the corresponding second programming pulse represents, for the target threshold voltage $Vth_h$, a final programming pulse of the sequence of programming pulses starting from the initial programming pulse $P_1$).

In the illustrated example of FIG. 2A:
  when considering the target threshold voltage $Vth_1$, the final programming pulse is the programming pulse $P_9$, thus a sequence of nine programming pulses from the initial programming pulse $P_1$ and nine program verify operations starting from the PV start programming pulse $P_1$ were necessary to program the selected memory cell at the target threshold voltage $Vth_1$;
  when considering the target threshold voltage $Vth_2$, the final programming pulse is the programming pulse $P_{12}$, thus a sequence of twelve programming pulses from the initial programming pulse $P_1$ and eight program verify operations starting from the PV start programming pulse $P_5$ were necessary to program the selected memory cell at the target threshold voltage $Vth_2$;
  when considering the target threshold voltage $Vth_3$, the final programming pulse is the programming pulse $P_{14}$, thus a sequence of fourteen programming pulses from the initial programming pulse $P_1$ and eight program verify operations starting from the PV start programming pulse $P_7$ were necessary to program the selected memory cell at the target threshold voltage $Vth_3$;
  when considering the target threshold voltage $Vth_4$, the final programming pulse is the programming pulse $P_{16}$, thus a sequence of sixteen programming pulses from the initial programming pulse $P_1$ and seven program verify operations starting from the PV start programming pulse $P_{10}$ were necessary to program the selected memory cell at the target threshold voltage $Vth_4$;
  when considering the target threshold voltage $Vth_5$, the final programming pulse is the programming pulse $P_{19}$, thus a sequence of nineteen programming pulses from the initial programming pulse $P_1$ and eight program verify operations starting from the PV start programming pulse $P_{12}$ were necessary to program the selected memory cell at the target threshold voltage $Vth_5$;
  when considering the target threshold voltage $Vth_6$, the final programming pulse is the programming pulse $P_{21}$, thus a sequence of twenty-one programming pulses from the initial programming pulse $P_1$ and seven program verify operations starting from the PV start programming pulse $P_{15}$ were necessary to program the selected memory cell at the target threshold voltage $Vth_6$, and
  when considering the target threshold voltage $Vth_7$, the final programming pulse is the programming pulse $P_{22}$, thus a sequence of twenty-two programming pulses from the initial programming pulse $P_1$ and six program verify operations starting from the PV start programming pulse $P_{17}$ were necessary to program the selected memory cell at the target threshold voltage $Vth_7$.

According to an embodiment, for each target threshold voltage $Vth_h$, the PV start programming pulse is a predefined programming pulse determined during a characterization phase. Similarly to a conventional approach, for each target threshold voltage $Vth_h$, the PV start programming pulse may be determined, for each ISPP group of memory cells, based on the memory cell, among the memory cells of the ISPP group of memory cells, having fastest programming times (hereinafter, fastest memory cell): just as an example, for each ISPP group of memory cells, the PV start programming pulse may be determined as the programming pulse that precedes, with a predefined margin, the final programming pulse of the fastest memory cell of the ISPP group of memory cells.

FIG. 2B shows a PV scheme (hereinafter referred to as fast PV scheme) associated with the fastest memory cell of a ISPP group of memory cells. As indicated above, according to the conventional approach, for each threshold voltage $Vth_h$ the final programming pulse associated with the fastest memory cell of each ISPP group of memory cells is used to determine (for that threshold voltage $Vth_h$) the PV start programming pulse for all the memory cells of that ISPP group of memory cells.

In the illustrated example of FIG. 2B:
  when considering the target threshold voltage $Vth_1$, the programming pulse $P_7$ is the final programming pulse of the fastest memory cell, thus a sequence of seven programming pulses from the initial programming pulse $P_1$ and seven program verify operations starting from the PV start programming pulse $P_1$ are required to program the fastest memory cell at the target threshold voltage $Vth_1$;

when considering the target threshold voltage $Vth_2$, the programming pulse $P_{10}$ is the final programming pulse of the fastest memory cell, thus a sequence of ten programming pulses from the initial programming pulse $P_1$ and six program verify operations starting from the PV start programming pulse $P_5$ are required to program the fastest memory cell at the target threshold voltage $Vth_2$;

when considering the target threshold voltage $Vth_3$, the programming pulse $P_{12}$ is the final programming pulse of the fastest memory cell, thus a sequence of twelve programming pulses from the initial programming pulse $P_1$ and eight program verify operations starting from the PV start programming pulse $P_7$ are required to program the fastest memory cell at the target threshold voltage $Vth_3$;

when considering the target threshold voltage $Vth_4$, the programming pulse $P_{14}$ is the final programming pulse, thus a sequence of fourteen programming pulses from the initial programming pulse $P_1$ and five program verify operations starting from the PV start programming pulse $P_{10}$ are required to program the fastest memory cell at the target threshold voltage $Vth_4$;

when considering the target threshold voltage $Vth_5$, the programming pulse $P_{17}$ is the final programming pulse, thus a sequence of seventeen programming pulses from the initial programming pulse $P_1$ and six program verify operations starting from the PV start programming pulse $P_{12}$ are required to program the fastest memory cell at the target threshold voltage $Vth_5$;

when considering the target threshold voltage $Vth_6$, the programming pulse $P_{19}$ is the final programming pulse, thus a sequence of nineteen programming pulses from the initial programming pulse $P_1$ and five program verify operations starting from the PV start programming pulse $P_{15}$ are required to program the fastest memory cell at the target threshold voltage $Vth_6$, and when considering the target threshold voltage $Vth_7$, the programming pulse $P_{21}$ is the final programming pulse, thus a sequence of twenty-one programming pulses from the initial programming pulse $P_1$ and five program verify operations starting from the PV start programming pulse $P_{17}$ are required to program the fastest memory cell at the target threshold voltage $Vth_7$.

According to an embodiment, the 3D memory device 100 (e.g., the memory controller 135 or any other module or circuit of the 3D memory device 100) is configured to store, for each target threshold voltage $Vth_h$, an indication of the respective PV start programming pulse (i.e., the predefined programming pulse determined during the characterization phase of the 3D memory device 100 based on the above-indicated conventional approach).

According to the principles of the present disclosure, the memory controller 135 is configured to, for a selected memory cell of a reference memory cell string (hereinafter, reference memory cell) to be programmed at the target threshold voltage $Vth_h$:

(i) determine, for the target threshold voltage $Vth_h$, an updated PV start programming pulse for the start of the program verify operations, wherein the updated PV start programming pulse follows, in the sequence of programming pulses, the PV start programming pulse (i.e., the predefined PV start programming pulse determined during the characterization phase of the 3D memory device 100), and (ii) for each subsequently-selected memory cell to be programmed at the target threshold voltage $Vth_h$ and exhibiting (i.e., reasonably exhibiting) similar electrical proprieties as the reference memory cell (hereinafter referred to as similar memory cell), perform the program verify operations according to the updated PV start programming pulse.

According to an embodiment, by iterating step (i) for each target threshold voltage $Vth_h$, an updated PV scheme for the reference memory cell is obtained which contains, for each target threshold voltage $Vth_h$, the respective updated PV start programming pulse to be used for programming each subsequently-selected similar memory cell (i.e., each subsequently-selected memory cell similar to the reference memory cell, including the reference memory cell itself).

According to an embodiment, a plurality of reference memory cells are provided. According to an embodiment, by iterating step (i) for each target threshold voltage $Vth_h$ and for each reference memory cell, a plurality of updated PV schemes are obtained, each one associated with a respective reference memory cell and containing, for each target threshold voltage $Vth_h$, the respective updated PV start programming pulse to be used for programming each subsequently-selected similar memory cell (i.e., each subsequently-selected memory cell similar to the respective reference memory cell, including the respective reference memory cell itself).

According to an embodiment, the similar memory cells may comprise (in addition to the reference memory cell itself) memory cells associated with the same word line as the reference memory cell. In this embodiment, the reference memory cells may comprise all the memory cells in the reference memory cell string, thus a number of updated PV schemes equal to the number of memory cells per memory cell string may be provided.

Differently from the 3D memory devices known in the art, wherein a fixed PV start programming pulse (i.e., the predefined PV start programming pulse determined during the characterization phase of the 3D memory device 100) for all the memory cells belonging to the same ISPP group of memory cells is provided based on the fastest memory cell of the ISPP group of memory cells, the 3D memory device 100 according to the present disclosure allows avoiding unnecessary program verify operations for the slower memory cells, thus reducing programming times: indeed, as better understood in the following when describing an updated PV scheme, for each target threshold voltage $Vth_h$, a number of program verify operations may be avoided or saved or skipped with respect to the PV scheme that would result by using the predefined PV start programming pulse for the slower memory cells.

According to an embodiment, the similar memory cells may comprise (in addition to the reference memory cell itself) memory cells associated with one or more word lines different from the word line associated with the reference memory cell. Just as an example, the similar memory cells may comprise (in addition to the reference memory cell itself) memory cells associated with one or more adjacent word lines being adjacent to the word line associated with the reference memory cell. In this embodiment, the reference memory cells may comprise a subset of the memory cells in the reference memory cell string, thus a number of updated PV schemes lower than the number of memory cells per memory cell string may be provided: this allows further reducing the programming times (in that, when selecting similar memory cells associated with different word lines, a single updated PV scheme has to be accessed).

According to an embodiment, the reference memory cell string comprises, for each memory block, an initial memory cell string of the memory block (in the example at issue, the memory cell string $115_{1,1}$).

According to an embodiment, the reference memory cell string comprises, for each memory block, a memory cell string being firstly programmed in the memory block (i.e., the memory cell string to which the firstly selected memory cell to be programmed belongs).

Let it be assumed that the PV scheme associated with the reference memory cell is the PV scheme of FIG. 2A (wherein, as indicated above, for each target threshold voltage $Vth_h$, the PV scheme associated with the reference memory cell (FIG. 2A) and the fast PV scheme (FIG. 2B) have, at the first selection of the selected memory cell for programming it at the target threshold voltage $Vth_h$, the same predefined PV start programming pulse). In this scenario:

when considering the target threshold voltage $Vth_1$, the final programming pulse $P_9$ of the reference memory cell follows the final programming pulse $P_7$ of the fastest memory cell (i.e., the reference memory cell is slower than the fastest memory cell in being programmed at the target threshold voltage $Vth_1$);

when considering the target threshold voltage $Vth_2$, the final programming pulse $P_{12}$ of the reference memory cell follows the final programming pulse $P_{10}$ of the fastest memory cell (i.e., the reference memory cell is slower than the fastest memory cell in being programmed at the target threshold voltage $Vth_2$);

when considering the target threshold voltage $Vth_3$, the final programming pulse $P_{14}$ of the reference memory cell follows the final programming pulse $P_{12}$ of the fastest memory cell (i.e., the reference memory cell is slower than the fastest memory cell in being programmed at the target threshold voltage $Vth_3$);

when considering the target threshold voltage $Vth_4$, the final programming pulse $P_{16}$ of the reference memory cell follows the final programming pulse $P_{14}$ of the fastest memory cell (i.e., the reference memory cell is slower than of the reference memory cell in being programmed at the target threshold voltage $Vth_4$);

when considering the target threshold voltage $Vth_5$, the final programming pulse $P_{19}$ of the reference memory cell follows the final programming pulse $P_{17}$ of the fastest memory cell (i.e., the reference memory cell is slower than the fastest memory cell in being programmed at the target threshold voltage $Vth_5$);

when considering the target threshold voltage $Vth_6$, the final programming pulse $P_{21}$ of the reference memory cell follows the final programming pulse $P_{19}$ of the fastest memory cell (i.e., the reference memory cell is slower than the fastest memory cell in being programmed at the target threshold voltage $Vth_6$); and when considering the target threshold voltage $Vth_7$, the final programming pulse $P_{22}$ of the reference memory cell follows the final programming pulse $P_{21}$ of the fastest memory cell (i.e., the reference memory cell is slower than the fastest memory cell in being programmed at the target threshold voltage $Vth_7$).

FIG. 2C shows an updated PV scheme that may be derived by the memory controller 135 based on the above scenario (wherein each symbol "X" denotes a respective "saved" or avoided program verify operation with respect to the PV scheme associated with the reference (slower) memory cell). In particular, in the considered updated PV scheme:

when considering the target threshold voltage $Vth_1$, the updated PV start programming pulse is the programming pulse $P_5$ (rather than the predefined programming pulse $P_1$), thus four program verify operations are saved or avoided or skipped when programming each subsequently-selected similar memory cell at the target threshold voltage $Vth_1$ according to the updated PV scheme;

when considering the target threshold voltage $Vth_2$, the updated PV start programming pulse is the programming pulse $P_8$ (rather than the predefined programing pulse $P_5$), thus three program verify operations are saved or avoided or skipped when programming each subsequently-selected similar memory cell at the target threshold voltage $Vth_2$ according to the updated PV scheme;

when considering the target threshold voltage $Vth_3$, the updated PV start programming pulse is the programming pulse $P_{10}$ (rather than the predefined programing pulse $P_7$), thus three program verify operations are saved or avoided or skipped when programming each subsequently-selected similar memory cell at the target threshold voltage $Vth_3$ according to the updated PV scheme;

when considering the target threshold voltage $Vth_4$, the updated PV start programming pulse is the programming pulse $P_{12}$ (rather than the predefined programing pulse $P_{10}$), thus two program verify operations are saved or avoided or skipped when programming each subsequently-selected similar memory cell at the target threshold voltage $Vth_4$ according to the updated PV scheme;

when considering the target threshold voltage $Vth_5$, the updated PV start programming pulse is the programming pulse $P_{15}$ (rather than the predefined programing pulse $P_{12}$), thus three program verify operations are saved or avoided or skipped when programming each subsequently-selected similar memory cell at the target threshold voltage $Vth_5$ according to the updated PV scheme;

when considering the target threshold voltage $Vth_6$, the updated PV start programming pulse is the programming pulse $P_{17}$ (rather than the predefined programing pulse $P_{15}$), thus two program verify operations are saved or avoided or skipped when programming each subsequently-selected similar memory cell at the target threshold voltage $Vth_6$ according to the updated PV scheme; and when considering the target threshold voltage $Vth_7$, the updated PV start programming pulse is the programming pulse $P_{18}$ (rather than the predefined programing pulse $P_{17}$), thus one program verify operation is saved or avoided or skipped when programming each subsequently-selected similar memory cell at the target threshold voltage $Vth_7$ according to the updated PV scheme.

According to an embodiment, as illustrated in the updated PV scheme of FIG. 2C, for each target threshold voltage $Vth_h$, the updated PV start programming pulse precedes, in the sequence of programming pulses, the final programming pulse of the reference memory cell by a predefined number of programming pulses. According to an embodiment, the predefined number of programming pulses may be an expected number of programming pulses. According to an embodiment, the predefined number of programming pulses is determined during the characterization phase. According to an embodiment, the predefined number of programming pulses may be set or changed from the external by the user (e.g., by means of an external command on the data bus). In the illustrated example, for each target threshold voltage $Vth_h$, the updated PV start programming pulse precedes, in the sequence of programming pulses, the final programming pulse of the reference memory cell by five programming pulses, and particularly:

- when considering the target threshold voltage $Vth_1$, the updated PV start programming pulse $P_5$ precedes the final programming pulse $P_9$ of the reference memory cell by five programming pulses;
- when considering the target threshold voltage $Vth_2$, the updated PV start programming pulse $P_8$ precedes the final programming pulse $P_{12}$ of the reference memory cell by five programming pulses;
- when considering the target threshold voltage $Vth_3$, the updated PV start programming pulse $P_{10}$ precedes the final programming pulse $P_{14}$ of the reference memory cell by five programming pulses;
- when considering the target threshold voltage $Vth_4$, the updated PV start programming pulse $P_{12}$ precedes the final programming pulse $P_{16}$ of the reference memory cell by five programming pulses;
- when considering the target threshold voltage $Vth_5$, the updated PV start programming pulse $P_{15}$ precedes the final programming pulse $P_{19}$ of the reference memory cell by five programming pulses;
- when considering the target threshold voltage $Vth_6$, the updated PV start programming pulse $P_{17}$ precedes the final programming pulse $P_{21}$ of the reference memory cell by five programming pulses; and
- when considering the target threshold voltage $Vth_7$, the updated PV start programming pulse $P_{18}$ precedes the final programming pulse $P_{22}$ of the reference memory cell by five programming pulses.

According to an embodiment, the predefined number of programming pulses may be the same for all the memory cells of the 3D memory device 100.

According to an embodiment, the predefined number of programming pulses may be the same for each ISPP group of memory cells (i.e., for each group of memory cells having same ISPP voltage step): in other words, in this embodiment, a plurality of predefined numbers of programming pulses may be provided, each one associated with a respective ISPP group of memory cell.

Figure 3:
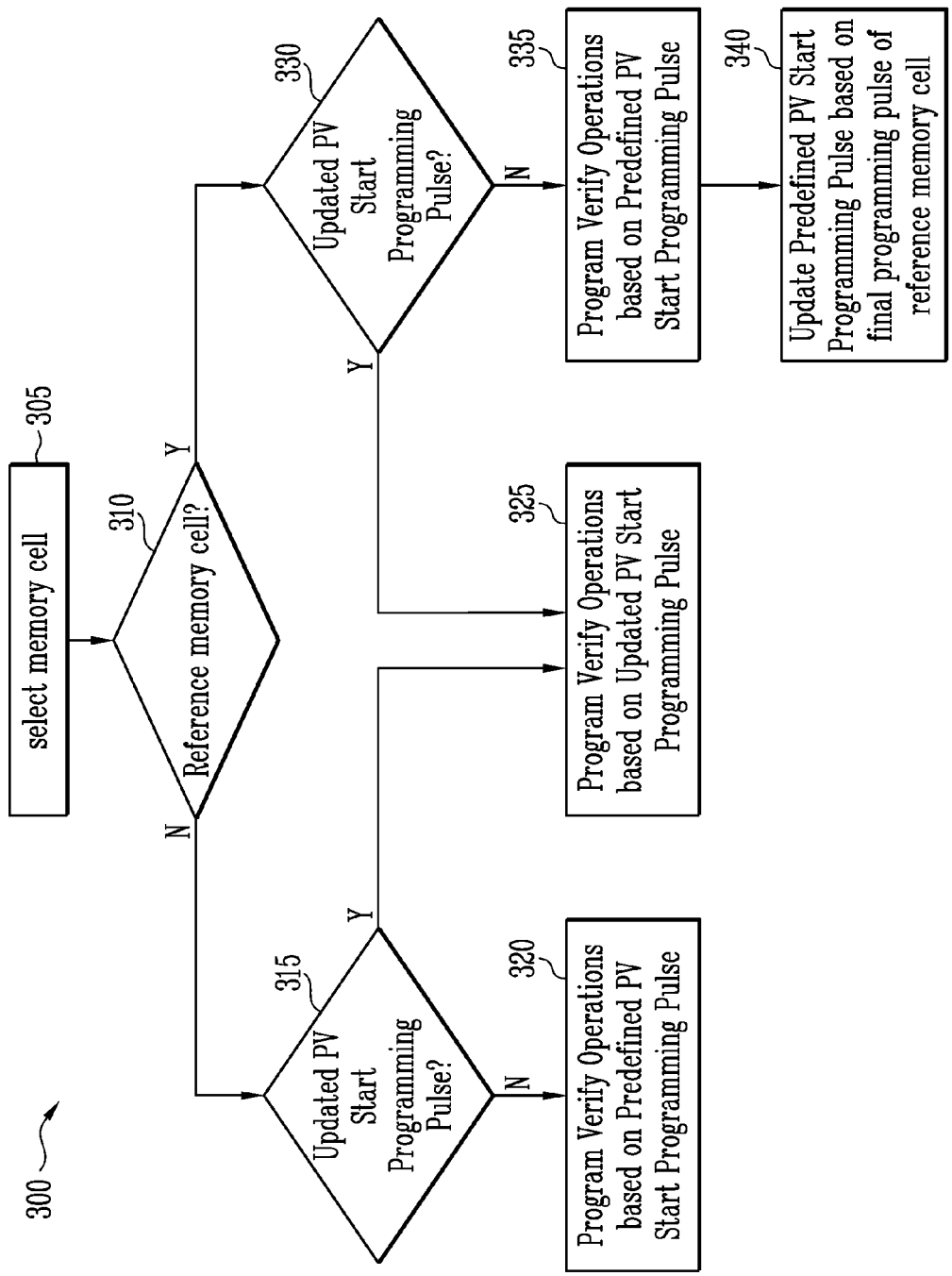
FIG. 3 shows an activity diagram of a method according to an embodiment of the present disclosure.

FIG. 3 shows an activity diagram of a method 300 according to an embodiment of the present disclosure.

According to an embodiment, the method 300 comprises, upon selection of a memory cell to be programmed at a target threshold voltage $Vth_h$ (action node 305), checking whether the selected memory cell is a reference memory cell (decision node 310), i.e. whether the selected memory cell belongs to the reference memory cell string. As described above, the reference memory cell string may comprise, for each memory block, an initial memory cell string of the memory block, or the memory cell string being firstly programmed in the memory block.

According to an embodiment, the method 300 comprises, if the selected memory cell is not a reference memory cell (exit branch N of decision node 310), checking whether an updated PV start programming pulse for the target threshold voltage $Vth_h$ (or, more generally, an updated PV scheme) has already been associated with the selected memory cell (decision node 315), i.e. checking whether an updated PV start programming pulse has already been determined, for the target threshold voltage $Vth_h$, for the reference memory cell exhibiting (i.e., reasonably exhibiting) similar electrical proprieties as the selected memory cell. Otherwise stated, at decision node 315 the method 300 comprises checking whether, for the target threshold voltage $Vth_h$, an updated PV start programming pulse (or, more generally, an updated PV scheme) has already been determined for the reference memory cell in respect of which the selected memory dell is a similar memory cell.

According to an embodiment, the method 300 comprises, if no updated PV start programming pulse is associated with the selected memory cell for the target threshold voltage $Vth_h$, (exit branch N of decision node 315), programming the selected memory cell and performing the corresponding program verify operation based on the predefined PV start programming pulse (action node 320).

According to an embodiment, the method 300 comprises, if an updated PV start programming pulse is associated with the selected memory cell for the target threshold voltage $Vth_h$ (exit branch Y of decision node 315), programming the selected memory cell based on the updated PV start programming pulse (i.e., by starting the corresponding program verify operations from the updated PV start programming pulse) (action node 325).

According to an embodiment, the method 300 comprises, if the selected memory cell is a reference memory cell (exit branch Y of decision node 310), checking whether an updated PV start programming pulse for the target threshold voltage $Vth_h$ (or, more generally, an updated PV scheme) has already been determined for the selected memory cell (decision node 330), i.e. checking whether an updated PV start programming pulse has already been determined, for the target threshold voltage $Vth_h$, for the reference memory cell being selected.

According to an embodiment, the method 300 comprises, if an updated PV start programming pulse is associated with the selected reference memory cell for the target threshold voltage $Vth_h$ (exit branch Y of decision node 330), programming the selected reference memory cell based on the updated PV start programming pulse (action node 325).

According to an embodiment, the method 300 comprises, if no updated PV start programming pulse is associated with the selected reference memory cell for the target threshold voltage $Vth_h$ (exit branch N of decision node 330), programming the selected memory cell and performing the corresponding program verify operation based on the predefined PV start programming pulse (i.e., by starting the corresponding program verify operations from the predefined PV start programming pulse) (action node 335).

According to an embodiment, the method 300 comprises determining, for the target threshold voltage $Vth_h$, an updated PV start programming pulse for the selected reference memory cell (action node 340) (which updated PV start programming pulse will be used for each subsequently-selected similar memory cell to be programmed at the target threshold voltage $Vth_h$). According to an embodiment, as described in the foregoing, the updated PV start programming pulse is determined based on the final programming pulse of the reference memory cell. According to an embodiment, as described in the foregoing, the updated PV start programming pulse precedes, in the sequence of programming pulses, the final programming pulse of the reference memory cell by a predefined number of programming pulses.

Figure 4:
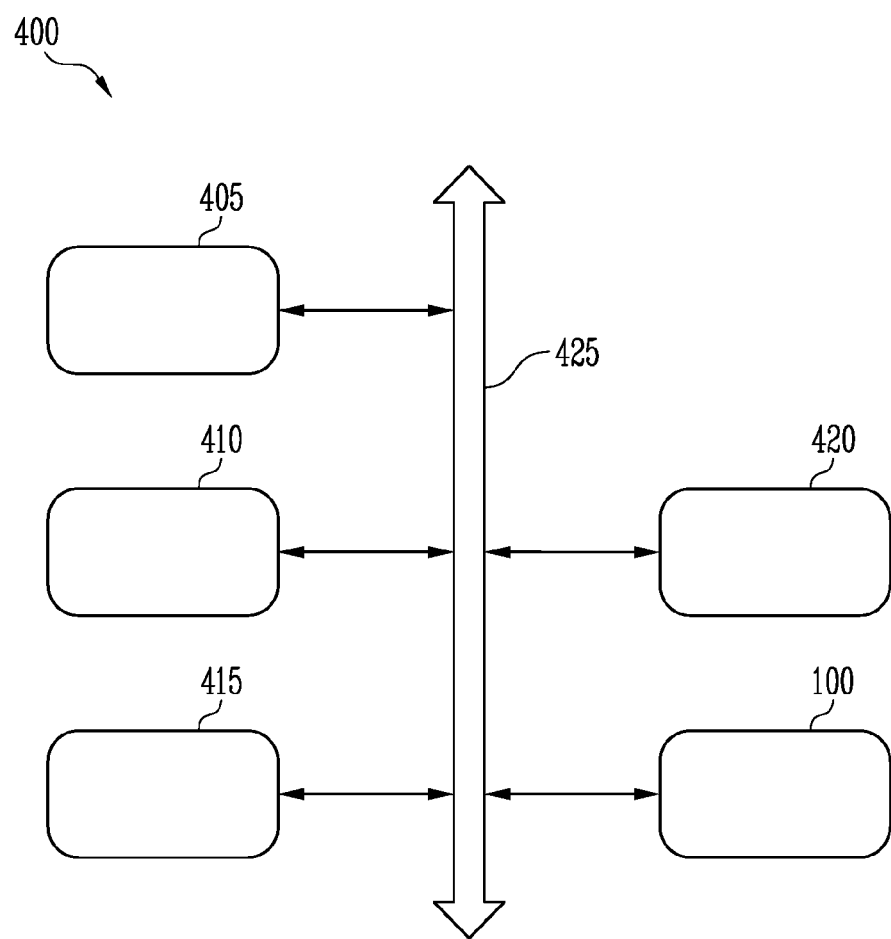
FIG. 4 shows a simplified block diagram of an electronic system according to an embodiment of the present disclosure.

FIG. 4 shows a simplified block diagram of an electronic system 400 according to an embodiment of the present disclosure.

According to an embodiment, the electronic system 400 comprises the 3D memory device 100 (or more thereof). The 3D memory device (100) comprises the plurality of memory cell strings, the plurality of word lines and the control circuit. The control circuit performs program verify operations in response to a respective programming pulse after applying a first programming pulse for a start of the program verify operations being a predefined programming pulse. The control circuit determines a updated first programming pulse based on result of the program verify operations. The program verify operations performs the program verify operations starting from the updated first programming pulse for each subsequently-selected memory cell.

According to an embodiment, the electronic system 400 may comprise a controller 405 (for example, one or more microprocessors and/or one or more microcontrollers). According to an embodiment, the one or more microprocessors and/or the one or more microcontrollers, or at least a subset thereof, may be embedded in the 3D memory device 100.

According to an embodiment, the electronic system 400 may comprise an input/output device 410, such as a screen and/or a keyboard.

According to an embodiment, the electronic system 400 may comprise a wireless interface 415 (e.g., one or more antennas and/or one or more wireless transceivers) for wirelessly exchanging messages with a wireless communication network (not shown).

According to an embodiment, the electronic system 400 may comprise a power supply device (for example, a battery) 420 for powering the electronic system 400.

According to an embodiment, the electronic system 400 may comprise one or more communication channels (bus) 425 to allow the exchange of data between the 3D memory device 100, the controller 405 (when provided), the input/output device 410 (when provided), the wireless interface 415 (when provided), and the power supply device 420 (when provided).

Naturally, in order to satisfy local and specific requirements, a person skilled in the art may apply to the teachings described above many logical and/or physical modifications and alterations. More specifically, although the present disclosure has been described with a certain degree of particularity with reference to preferred embodiments thereof, it should be understood that various omissions, substitutions and changes in the form and details as well as other embodiments are possible. In particular, different embodiments of the disclosure may even be practiced without the specific details set forth in the preceding description for providing a more thorough understanding thereof; on the contrary, well-known features may have been omitted or simplified in order not to encumber the description with unnecessary details. Moreover, it is expressly intended that specific elements and/or method steps described in connection with any disclosed embodiment of the disclosure may be incorporated in any other embodiment.

In particular, similar considerations apply if the 3D memory device (and/or the system comprising the 3D memory device) has a different structure or comprises equivalent components. In any case, any component thereof may be separated into several elements, or two or more components may be combined into a single element; furthermore, each component can be replicated to support the execution of the corresponding operations in parallel. It should also be noted that (unless otherwise indicated) any interaction between different components generally does not need to be continuous, and may be either direct or indirect through one or more intermediaries.

What is claimed is:

1. A three-dimensional memory device (100), comprising:
   a plurality of memory cell strings ($115_{n,1}$), each memory cell string comprising a plurality of memory cells ($T_k$) stacked onto one another on a substrate each one at a respective vertical distance from the substrate;
   a plurality of word lines ($WL_k$) each one associated with respective memory cells of the plurality of memory cell strings arranged at a same vertical distance from the substrate; and
   a control circuit (135) configured to:
   (i) apply a sequence of incremental step programming pulses to a selected memory cell of a reference memory cell string to program the selected memory cell at a target threshold voltage among a plurality of target threshold voltages;
   (ii) perform a program verify operation in response to a respective programming pulse after applying a first programming pulse of the sequence of incremental step programming pulses, the first programming pulse is for a start of program verify operations, and is a predefined programming pulse determined by the three-dimensional memory device;
   (iii) determine another pulse of the sequence of incremental step programming pulses to be an updated first programming pulse for the selected memory cell and for the target threshold voltage based on a second programming pulse that is a final programming pulse of the sequence of incremental step programming pulses after which a program verify operation determines that the selected memory cell has been programmed at the target threshold voltage; and
   (iv) perform the program verify operations starting from the updated first programming pulse for each subsequently-selected memory cell to be programmed at the target threshold voltage, and
   associated with the same word line as the selected memory cell.

2. The three-dimensional memory device (100) of claim 1, wherein the control circuit (135) is configured to repeat steps (i), (ii), (iii), and (iv) for each target threshold voltage among the plurality of target threshold voltages.

3. The three-dimensional memory device (100) of claim 1, wherein the updated first programming pulse precedes, in the sequence of incremental step programming pulses, the second programming pulse by a predefined number of programming pulses.

4. The three-dimensional memory device (100) of claim 3, wherein the predefined number of programming pulses is the same for each group of memory cells having a same incremental voltage step between subsequent programming pulses.

5. The three-dimensional memory device (100) of claim 1, wherein the control circuit (135) is configured to perform the program verify operation in response to a respective programming pulse starting in response to the updated first programming pulse, and does so during the incremental step programming pulses for each subsequently-selected memory cell associated with the same word line ($WL_k$) as the selected memory cell and for each subsequently-selected memory cell associated with at least one word line different from said same word line.

6. The three-dimensional memory device (100) of claim 5, wherein the at least one word line different from said same word line comprises at least one adjacent word line being adjacent to said same word line.

7. The three-dimensional memory device (100) of claim 1, comprising a plurality of memory blocks (110) each one comprising a subset of the plurality of memory cell strings, wherein the reference memory cell string comprises, for each memory block, an initial memory cell string of the memory block or a memory cell string being firstly programmed in the memory block.

8. The three-dimensional memory device (100) of claim 1, wherein the control circuit (135) is configured to repeat steps (i), (ii), (iii), and (iv) for each one of at least one further selected memory cell of the reference memory cell string.

9. The three-dimensional memory device (100) of claim 1, wherein each of the memory cells ($T_k$) is a single-level memory cell or multiple-level memory cell.

10. An electronic system (400) comprising at least one three-dimensional memory device (100) of claim 1.

11. A method (300) for operating a three-dimensional memory device (100), wherein the three-dimensional memory device comprises a plurality of memory cell strings (115) each one comprising a plurality of memory cells ($T_k$) stacked onto one another on a substrate each one at a respective vertical distance from the substrate, and a plurality of word lines ($WL_k$) each one associated with respective memory cells of the plurality of memory cell strings arranged at a same vertical distance from the substrate, the method comprising:

(i) applying a sequence of incremental step programming pulses to a selected memory cell of a reference memory cell string to program the selected memory cell at a target threshold voltage among a plurality of target threshold voltages (320; 335);

(ii) performing a program verify operation in response to a respective programming pulse after applying a first programming pulse of the sequence of incremental step programming pulses (320; 335), the first programming pulse is for a start of program verify operations, and is a predefined programming pulse determined by the three-dimensional memory device;

(iii) determining another pulse of the sequence of incremental step programming pulses to be an updated first programming pulse for the selected memory cell and for the target threshold voltage based on a second programming pulse that is a final programming pulse of the sequence of incremental step programming pulses after which a program verify operation determines that the selected memory cell has been programmed at the target threshold voltage (340); and (iv) performing the program verify operations starting from the updated first programming pulse for each subsequently-selected memory cell to be programmed at the target threshold voltage and associated with the same word line as the selected memory cell (325).

\* \* \* \* \*